United States Patent
Bock

(10) Patent No.: US 6,891,145 B2
(45) Date of Patent: *May 10, 2005

(54) MICRO POWER MICRO-SIZED CMOS ACTIVE PIXEL

(75) Inventor: Nikolai E. Bock, Pasadena, CA (US)

(73) Assignee: Micron Technology, Inc., Boise, ID (US)

(*) Notice: Subject to any disclaimer, the term of this patent is extended or adjusted under 35 U.S.C. 154(b) by 340 days.

This patent is subject to a terminal disclaimer.

(21) Appl. No.: 10/146,667

(22) Filed: May 14, 2002

(65) Prior Publication Data

US 2002/0190192 A1 Dec. 19, 2002

Related U.S. Application Data

(63) Continuation of application No. 09/418,961, filed on Oct. 14, 1999, now Pat. No. 6,388,242.
(60) Provisional application No. 60/104,295, filed on Oct. 14, 1998.

(51) Int. Cl.$^7$ ............................................... H01J 40/14
(52) U.S. Cl. .................................. 250/214 R; 250/208.1
(58) Field of Search ........................ 250/214 R, 214.1, 250/208.1; 348/297, 304, 308; 257/290, 291, 440

(56) References Cited

U.S. PATENT DOCUMENTS

| | | | | |
|---|---|---|---|---|
| 5,471,515 A | * | 11/1995 | Fossum et al. | ............... 377/60 |
| 5,880,460 A | * | 3/1999 | Merrill | ............... 250/208.1 |
| 6,054,704 A | * | 4/2000 | Pritchard et al. | ............... 250/208.1 |
| 6,097,022 A | * | 8/2000 | Merrill et al. | ............... 250/208.1 |
| 6,140,630 A | * | 10/2000 | Rhodes | ............... 250/208.1 |
| 6,469,332 B1 | * | 10/2002 | Berezin | ............... 257/292 |

* cited by examiner

Primary Examiner—Que T. Le
(74) Attorney, Agent, or Firm—Dickstein Shapiro Morin & Oshinsky LLP

(57) ABSTRACT

Reduced size CMOS active pixel circuit uses special transistors with their gates and sources connected together. This transistor is placed at the top of the pixel.

10 Claims, 1 Drawing Sheet

MICRO POWER MICRO-SIZED CMOS ACTIVE PIXEL

CROSS REFERENCE TO RELATED APPLICATIONS

This application is a continuation of U.S. application Ser. No. 09/418,961, filed Oct. 14, 1999, now U.S. Pat. No. 6,388,242, which claims the benefit of U.S. provisional application Ser. No. 60/104,295, filed Oct. 14, 1998.

BACKGROUND

Active pixel sensors are well known in the art. A basic active pixel sensor is described in U.S. Pat. No. 5,471,515. An active pixel sensor typically includes a plurality of pixel circuitry units. Each unit, or "pixel" includes a photoreceptor, a buffer, and a select transistor. Some means of resetting the pixel is also provided.

It is desirable to make each pixel as small as possible to enable more pixels to fit on a single chip. For example, a desirable size in current technology is 5×5 $\mu m^2$. It is also desirable to keep the supply voltages low as possible. For example, it would be useful if an active pixel sensor could operate from a single 1.5 volt battery. This provides limitations on the way in which such a device can operate.

SUMMARY

The present application features a new pixel structure which has certain advantages, and can operate using relatively low power.

The present application defines an active pixel unit, that has a charge accumulating part, having a capability of accumulating charge therein; a photoreceptor, connected to said charge accumulating part, and changing an amount of charge therein based on an applied received charge; a reset transistor, having its drain and gate connected together, and connected to reset said charge accumulating part; and a select transistor, also having its drain and gate connected together, and connected to select an output of said charge accumulating part.

BRIEF DESCRIPTION OF THE DRAWINGS

These and other aspects of the invention will be described in detail with reference to the accompanying drawings, wherein.

DESCRIPTION OF THE EMBODIMENTS

Figure 1:
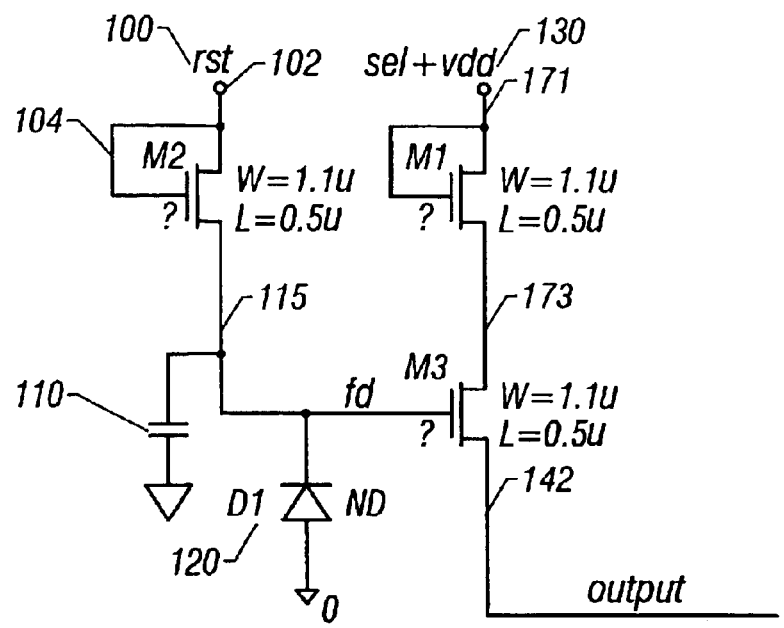
FIG. 1 shows a schematic diagram of the exemplary pixel.
Figure 2:
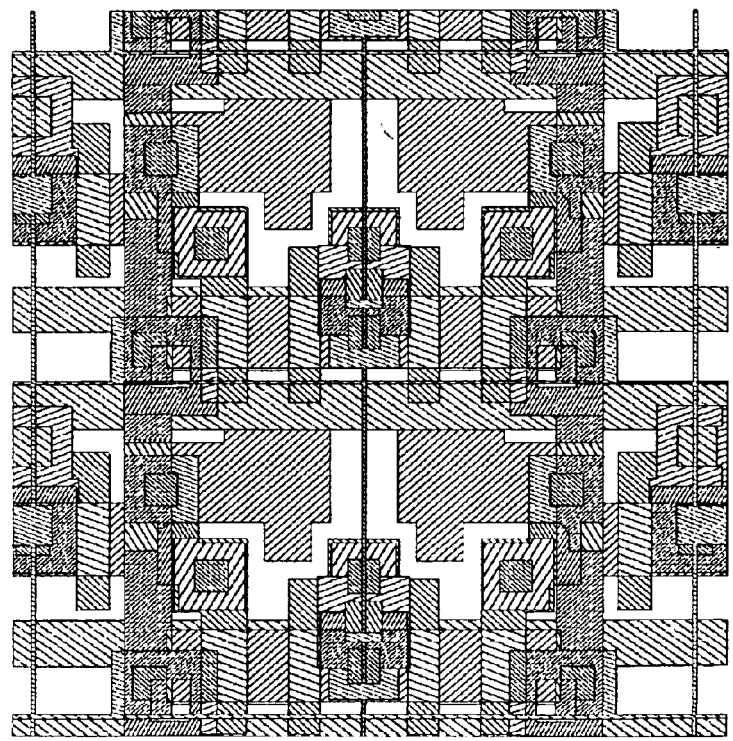
FIG. 2 shows a layout of the exemplary pixel.

The pixel schematic is shown in FIG. 1. The pixel, includes three transistors M1, M2 and M3 which are configured and connected together in a new way.

A floating diffusion 115 collects charge. This can include an integration capacitor 110, which can be formed from a dedicated capacitor, or from stray capacitance.

The reset transistor M2 controls the passage of reset level 100 to the integration capacitor 110. Integration capacitor 110 is reset to the high level of the reset signal. A desirable value is about 1.6 volts.

The reset transistor M2 has a drain 102 and gate 104 which are connected together. This allows charging the floating diffusion 115 to a potential that is higher than VDD. The reset pulse 100, for example, can be produced by a booster, e.g. a charge pump. By using this system, the floating diffusion 115, with the integration capacitor 110 connected thereto, can be charged to a higher level, even if low voltage operation is used.

The reset level of the capacitor is sampled as described herein.

After reset, the photodiode 120 receives photons indicative of light applied to that particular pixel. The charging of the photodiode discharges the integration capacitor 110. The amount of discharge of the integration capacitor 110 eventually sets the amount of received charge on the pixel.

At the end of the integration period, the select line 130 is brought active. This turns on the transistor M1, whose drain and gate are also connected together. The select value is passed through the transistor M1 to the drain of M3, configured as a source follower transistor. The source 142 of M3 produces an output indicative of the reset value on the capacitor 110, minus the amount of charge discharged, through the photodiode 120.

While the select value is still on, the integration capacitor is reset as described above. The reset value is also read from the output in preparation for the next integration cycle. In addition, the select transistor M1 can be placed physically on top of the active pixel source follower transistor. This allows a new layout consideration which was not previously enabled by the art. This can also improve the gain and dynamic range of the source follower.

Other embodiments are within the disclosure.

What is claimed:

1. A method of operating a pixel unit of an imaging device, said method comprising:

resetting a charge accumulation region with a reset pulse having a voltage greater than an operating voltage of said imaging device;

accumulating charge provided by a photoreceptor at said charge accumulation region; and selectively outputting a signal based on the charge at said accumulation region produced by said photoreceptor.

2. The method of claim 1, wherein the reset pulse comprises an output voltage of a booster circuit.

3. The method of claim 1, further comprising applying said reset pulse to a gate and one of a source/drain region of a reset transistor, and resetting said charge accumulation region by a signal produced at the other of said source/drain region of said reset transistor.

4. The method of claim 1, wherein said selectively outputting comprises selectively applying a select signal to a gate and one of a source/drain terminal of a select transistor, the other of said source/drain terminal providing an operating voltage for an output transistor having a gate coupled to receive a signal from said charge accumulation region.

5. The method of claim 4, wherein said select signal has a voltage greater than said operating voltage of said imaging device.

6. An integrated circuit, comprising:

a charge accumulating region on said integrated circuit, said region receiving accumulated charge therein;

a photoreceptor, coupled to said charge accumulating region, for changing an amount of charge therein based on an applied image signal;

a reset transistor, having a drain and gate terminal coupled together, said reset transistor activating to provide a reset pulse to said charge accumulation region; and a select transistor, having a drain and gate terminal coupled together, and coupled to selectively cause the production of an output signal based on the charges at said charge accumulation region.

7. The integrated circuit of claim 6, further comprising a source follower transistor, having a gate coupled to said charge accumulation region and one source/drain region coupled to said transistor and another source/drain region providing said output signal.

8. The integrated circuit of claim 6, wherein the reset pulse has a voltage greater than an operating voltage of the integrated circuit.

9. The integrated circuit of claim 6, wherein the select transistor receives a select signal at a gate and one of a source/drain terminal, the other of said source/drain terminal providing the operating voltage for an output transistor having a gate coupled to said charge accumulation region.

10. The integrated circuit of claim 9, wherein the select signal has a voltage greater than an operating voltage of the integrated circuit.

* * * * *